United States Patent [19]
Nara et al.

[11] Patent Number: 5,617,211
[45] Date of Patent: Apr. 1, 1997

[54] EXPOSURE APPARATUS

[75] Inventors: Kei Nara, Yokohama; Toshio Matsuura; Muneyasu Yokota, both of Tokyo; Yukio Kakizaki, Yokohama; Yoshio Fukami, Yokohama; Seiji Miyazaki, Yokohama; Tsuyoshi Narabe, Omiya, all of Japan

[73] Assignee: Nikon Corporation, Japan

[21] Appl. No.: 515,783

[22] Filed: Aug. 16, 1995

[30] Foreign Application Priority Data

| Aug. 16, 1994 | [JP] | Japan | 6-215310 |
| Aug. 16, 1994 | [JP] | Japan | 6-215311 |
| Aug. 16, 1994 | [JP] | Japan | 6-215312 |

[51] Int. Cl.⁶ ............ G01B 11/00; G01U 21/86; G06K 7/015; G03B 27/52
[52] U.S. Cl. .......... 356/401; 356/399; 356/400; 250/548; 250/559.3; 355/43; 355/53
[58] Field of Search ............ 356/399–401, 356/152, 372; 250/548, 559.3, 201; 355/43, 53, 62; 364/559

[56] References Cited

U.S. PATENT DOCUMENTS

| 3,943,359 | 3/1976 | Matsumoto | 250/201 |
| 4,103,998 | 8/1978 | Nakazawa | 356/152 |
| 4,269,505 | 5/1981 | Mayer | 355/62 |
| 4,629,313 | 12/1986 | Tanimoto | 355/53 |
| 4,655,600 | 4/1987 | Tanigawa | 356/401 |
| 4,723,221 | 1/1988 | Matsuura | 364/559 |
| 4,801,208 | 1/1989 | Katoh | 356/401 |
| 4,801,808 | 1/1989 | Hamasaki | 250/548 |
| 5,044,750 | 9/1991 | Shamble | 356/372 |
| 5,237,393 | 8/1993 | Tominaga | 356/401 |
| 5,296,917 | 3/1994 | Kusonose | 356/401 |
| 5,444,538 | 8/1995 | Pellegrini | 356/401 |

*Primary Examiner*—Georgia Y. Epps
*Assistant Examiner*—Michael P. Stafira
*Attorney, Agent, or Firm*—Pennie & Edmonds

[57] ABSTRACT

This invention relates to an exposure apparatus for synchronously scanning a mask and a photosensitive substrate with respect to a plurality of projection optical systems, thereby properly transferring an entire pattern area on the mask onto the photosensitive substrate. A plurality of sets of mask-side reference marks and substrate-side reference marks are arranged at positions corresponding to each other on the mask surface and the photosensitive substrate surface and at least at two positions conjugate with the plurality of projection optical systems. The displacement amount between an image of a mask-side reference mark or a substrate-side reference mark formed on the corresponding substrate-side reference mark or mask-side reference mark through the projection optical system and the position of the substrate-side reference mark and the mask-side reference mark is measured. The imaging characteristics of the plurality of projection optical systems are corrected in accordance with the displacement amount.

19 Claims, 15 Drawing Sheets

EXPOSURE APPARATUS

BACKGROUND OF THE INVENTION

1. Field of the Invention

The present invention relates to an exposure apparatus and, more particularly, to an exposure apparatus which has a plurality of illumination optical systems and projection optical systems, and is used for manufacturing a semiconductor element or a liquid crystal display substrate.

2. Related Background Art

Conventionally, liquid crystal display substrates are widely used as display elements for personal computers or TV sets. A liquid crystal display substrate is manufactured by patterning a transparent thin-film electrode on a glass substrate into a desired shape by photolithography. A projection exposure apparatus for exposing an original image pattern formed on a mask onto a photoresist layer on the glass substrate through a projection optical system is used as an apparatus for lithography.

Recently, an increase in size of a liquid crystal display substrate is required. Accordingly, an increase in exposure area is also required for a projection exposure apparatus. As a means for increasing the exposure area, a scanning exposure apparatus having a plurality of projection lenses is available. More specifically, in this scanning exposure apparatus, a light beam emitted from a light source is unified in its light amount through an optical system including a fly-eye lens, and formed into a desired shape through a field stop thereby illuminating the pattern surface of a mask.

A plurality of illumination systems with the above arrangement are arranged, and different small areas (illumination areas) on the mask are respectively illuminated with light beams emerging from the plurality of illumination systems. The light beams transmitted through the mask form the pattern image of the mask on different projection areas on the glass substrate through a plurality of projection lenses, respectively. By synchronously scanning the mask and the glass substrate with respect to the projection lenses, the entire surface of the pattern area on the mask is transferred onto the glass substrate.

SUMMARY OF THE INVENTION

The present invention relates to an exposure apparatus having a plurality of illumination optical systems for irradiating a light beam from a light source to a plurality of partial areas in a pattern area of a mask, a plurality of projection optical systems which are arranged along a predetermined direction and displaced from each other in a direction perpendicular to the predetermined direction, and project an image of each of the plurality of partial areas onto a photosensitive substrate with the light beam transmitted through the mask while overlapping positions in the predetermined direction of adjacent ones of the images, and scanning means for synchronously scanning the mask and the photosensitive substrate with respect to the projection optical systems in a direction substantially perpendicular to the predetermined direction; which exposure apparatus transfers the overall pattern area on the mask onto the photosensitive substrate by scanning the mask and the photosensitive substrate with respect to the projection optical systems. This apparatus comprises a plurality of sets of mask-side reference marks and substrate-side reference marks, which are arranged at positions corresponding to each other on the mask surface and the photosensitive substrate surface and at least at two positions conjugate with the plurality of projection optical systems, displacement amount measurement means for measuring a displacement amount between a position of an image of the mask-side reference mark or the substrate-side reference mark, which image is formed on a corresponding one of the substrate-side reference marks or the mask-side reference marks through the projection optical system, and a position of the substrate-side reference mark or the mask-side reference mark, and lens adjustment means for correcting the imaging characteristics of the plurality of projection optical systems in accordance with the displacement amount measured by the displacement amount measurement means.

In the present invention, the plurality of mask-side reference marks and the plurality of substrate-side reference marks are integrally arranged on a block having a sufficient rigidity so as to be held at positions corresponding to each other on the mask surface and the photosensitive substrate surface.

In the present invention, correction of the imaging characteristics is performed as follows. In accordance with the displacement amount measured by the displacement amount measurement means, values for adjusting at least one of the projection magnifications of the projection optical systems, and the rotations and shifts of the projected images are obtained as a plurality of correction values for minimizing distortions in projected images of the plurality of projection optical systems, and the imaging characteristics of the projection optical systems are changed by the plurality of lens adjustment means to change at least one of the magnifications of the plurality of projection optical systems, and the rotations and shifts of the projected images in accordance with the plurality of correction values.

The present invention relates to an exposure apparatus having a plurality of illumination optical systems for irradiating a light beam from a light source to a plurality of partial areas in a pattern area of a mask a plurality of projection optical systems which are arranged along a predetermined direction and displaced from each other in a direction perpendicular to the predetermined direction, and project an image of each of the plurality of partial areas onto a photosensitive substrate with the light beam transmitted through the mask while overlapping positions in the predetermined direction of adjacent ones of the images, and scanning means for synchronously scanning the mask and the photosensitive substrate with respect to the projection optical systems in a direction substantially perpendicular to the predetermined direction, which exposure apparatus transfers the overall pattern area on the mask onto the photosensitive substrate by scanning the mask and the photosensitive substrate with respect to the projection optical systems. This apparatus comprises a plurality of mask-side reference marks and substrate-side reference marks, which are arranged an positions corresponding to each other on the mask surface and the photosensitive substrate surface and at positions corresponding to the positions overlapping each other and aligned in lines in the predetermined direction, displacement amount measurement means for measuring a displacement amount between a position of an image of the mask-side reference mark or the substrate-side reference mark, which image is formed on a corresponding one of the substrate-side reference marks or the mask-side reference marks through the projection optical system, and a position of the substrate-side reference mark or the mask-side reference mark, and lens adjustment means for correcting the imaging characteristics of the plurality of projection optical systems in accordance with the displacement amount measured by the displacement amount measurement means.

The present invention relates to an exposure apparatus having a plurality of illumination optical systems for irradiating a light beam from a light source to a plurality of partial areas in a pattern area of a mask, a plurality of projection optical systems which are arranged along a predetermined direction and displaced from each other in a direction perpendicular to the predetermined direction, and project an image of each of the plurality of partial areas onto a photosensitive substrate with the light beam transmitted through the mask while overlapping positions in the predetermined direction of adjacent ones of the images, and scanning means for synchronously scanning the mask and the photosensitive substrate with respect to the projection optical systems in a direction substantially perpendicular to the predetermined direction, which exposure apparatus transfers the overall pattern area on the mask onto the photosensitive substrate by scanning the mask and the photosensitive substrate with respect to the projection optical systems. This apparatus comprises two sets of mask-side first reference marks and substrate-side first reference marks, which are arranged at positions corresponding to each other on the mask surface and the photosensitive substrate surface and at positions conjugate with the projection optical systems at two ends of the line of the plurality of projection optical systems, a plurality of mask-side second reference marks and substrate-side second reference marks arranged at positions corresponding to each other on the mask surface and the photosensitive substrate surface and aligned in lines in the predetermined direction in correspondence with the overlapping positions, one of which is fixed and the other of which is movable with respect to the mask-side first reference marks and the substrate-side first reference marks, displacement amount measurement means for measuring a displacement amount between images of the mask-side first reference marks and the mask-side second reference marks, each of which images is formed through a corresponding one of the plurality of projection optical systems, and the substrate-side first reference marks and substrate-side second reference marks, or a displacement amount between images of the substrate-side first reference marks and the substrate-side second reference marks, each of which images is formed through a corresponding one of the plurality of projection optical systems, and the mask-side first reference marks and the mask-side second reference marks, and lens adjustment means for correcting imaging characteristics of each of the plurality of projection optical systems in accordance with the displacement amount measured by the displacement amount measurement means.

In the present invention, the plurality of mask-side first reference marks and the plurality of substrate-side first reference marks are integrally arranged on a block having a sufficient rigidity so as to be held at positions corresponding to each other on the mask and the photosensitive substrate.

In the present invention, values for adjusting at least one of the projection magnifications of the end projection optical systems, and the rotations and shifts of the projected images are obtained by the displacement amount measurement means as correction values for minimizing distortions in the projected images through the end projection optical systems by using the mask-side first reference marks and the substrate-side first reference marks. The imaging characteristics are changed by changing at least one of the magnifications of the end projection optical systems, and the rotations and shifts of the projected images by the lens adjustment means in accordance with the correction values. The mask-side second reference marks or the substrate-side second reference marks are moved and positioned such that the images of the movable mask-side second reference marks or the movable substrate-side second reference marks, which images are formed through the changed end projection optical systems, match the fixed substrate-side second reference marks or the mask-side second reference marks. Values for adjusting at least one of the projection magnifications of the projection optical systems, and the rotations and shifts of the projected images are obtained by the displacement amount measurement means as correction values for minimizing distortions in the projected images through the projection optical systems at the two ends by using the mask-side second reference marks and the substrate-side second reference marks. The imaging characteristics are corrected by changing at least one of the magnifications of the plurality of projection optical systems, and the rotations and shifts of the projected images by the lens adjustment means in accordance with the correction values.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the above-described conventional scanning exposure apparatus, a continuous pattern of a mask is divided by a plurality of projection lenses. The divided images are projected onto a glass substrate through the projection lenses to form no gaps therebetween or to overlap each other by a predetermined amount. Therefore, if the imaging characteristics of the projection lenses are poor, the divided images are not continuously formed on the glass substrate.

In assembling a plurality of projection lenses, they are adjusted to optimize the imaging characteristics, though this operation is difficult and time-consuming. Since the imaging characteristics may change with time even after assembling, the adjustment is insufficient in practical meaning.

The present invention has been made in consideration of the above situations, and has as its object to provide an exposure apparatus capable of properly transferring an entire pattern area on a mask onto a photosensitive substrate by synchronously scanning the mask and the photosensitive substrate with respect to a plurality of projection optical systems.

First Embodiment

Figure 1:
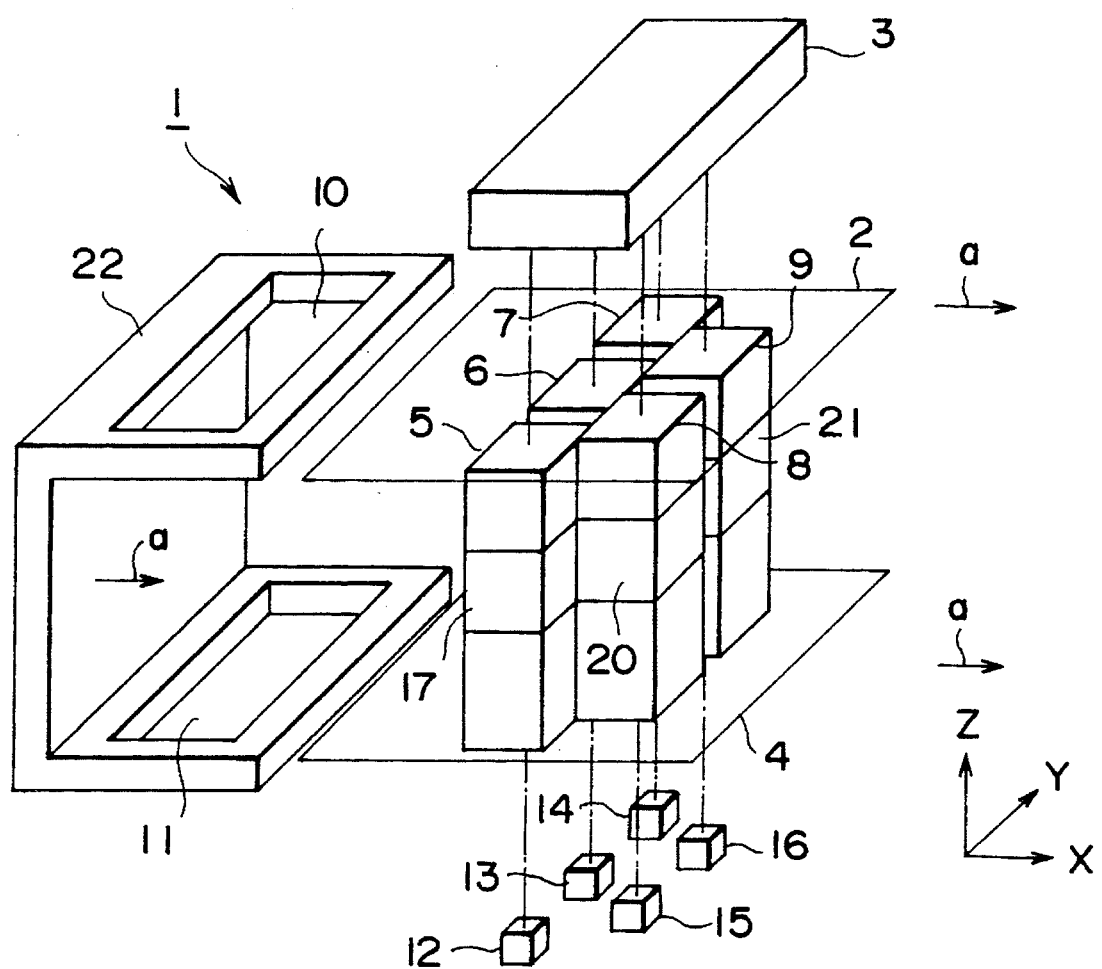
FIG. 1 is a perspective view schematically showing a scanning exposure apparatus according to the first embodiment.

FIG. 1 is a perspective view showing a scanning exposure apparatus 1 in which an erect image is formed at a magnification of 1. This exposure apparatus 1 is constituted by an illumination system 3 for irradiating a light beam onto a mask 2, and projection lenses 5 to 9 for projecting a pattern on the mask 2 onto a photosensitive substrate (glass substrate) 4. When the mask 2 and the photosensitive substrate 4 are synchronously scanned with respect to the illumination system 3 and the projection lenses 5 to 9 in a direction indicated by an arrow a, the entire pattern area on the mask 2 can be transferred onto the photosensitive substrate 4. In the exposure apparatus 1, to measure the projection positions of patterns projected onto the photosensitive substrate 4 through the projection lenses 5 to 9, measurement devices 12 to 16 are arranged at corresponding positions.

The projection lenses 5 to 9 respectively have lens adjustment mechanisms 17 to 21 for adjusting the imaging characteristics of the projection lenses 5 to 9, thereby adjusting the image displacement amounts measured by the measurement devices 12 to 16. The illumination system 3, the projection lens 5, and the measurement device 12 are aligned with their optical axes matching each other. The illumination optical system 3, the projection lenses 6 to 9, and the measurement devices 13 to 16 are similarly arranged. The projection lenses 5 to 9 are arranged in two lines, one line consisting of the projection lenses 5 to 7 and the other line consisting of the projection lenses 8 and 9. The projection lenses 5 to 9 are arranged in a staggered manner such that adjacent exposure images of the pattern (e.g., images projected by the projection lens 5 and 8, or 8 and 6) overlap each other by a predetermined amount (e.g., 5 [mm]). Therefore, the pattern on the mask 2 is divided by the projection lenses 5 to 9 and focused on the photosensitive substrate 4 at a magnification of 1:1.

On one side, in the scanning direction, of the mask 2 and the photosensitive substrate 4, a C-shaped block 22 having a mask-side reference mark 10 arranged on the same plane as the mask 2 and a substrate-side reference mark 11 arranged on the same plane as photosensitive substrate 4 is disposed on a scanning exposure stage (not shown) together with the mask 2 and the photosensitive substrate 4. In this exposure apparatus 1, the imaging characteristics (e.g., distortion) of the projection lenses 5 to 9 can be measured by using the mask-side reference mark 10 and the substrate-side reference mark 11.

Figure 2:
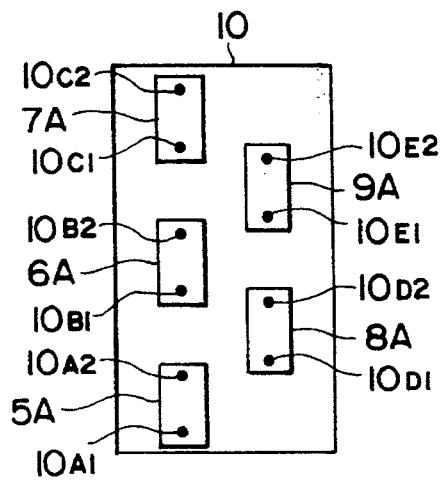
FIG. 2 is a view showing the arrangement of a mask-side reference mark.
Figure 3:
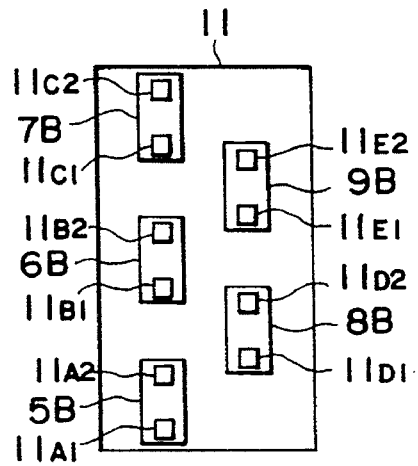
FIG. 3 is a view showing the arrangement of a substrate-side reference mark.

As shown in FIGS. 2 and 3, marks $10_{Ai}$ to $10_{Ei}$ and $11_{Ai}$ to $11_{Ei}$ are formed on the mask-side reference mark 10 and the substrate-side reference mark 11, respectively, in correspondence with each other. Each of exposure areas 5A and 5B to 9A and 9B of the projection lenses 5 to 9 has a corresponding pair of marks $10_{A1}$ and $10_{A2}$ to $10_{E1}$ and $10_{E2}$ and $11_{A1}$ and $11_{A2}$ to $11_{E1}$ and $11_{E2}$.

Any manufacturing error generated between the mask-side reference mark 10 and the corresponding substrate-side reference mark 11 is minimized. For example, a resist is coated on a glass material having a chromium (Cr) film thereon, a mark is exposed by a high-precision exposure apparatus such as a stepper, and etching is performed, thereby obtaining chromium marks $10_{Ai}$ to $10_{Ei}$ and $11_{Ai}$ to $11_{Ei}$. In this manner, the manufacturing error between the mask-side reference mark 10 and the substrate-side reference mark 11 has the same precision level as that of a measurement means such as a laser interferometer for managing the position in the exposure apparatus. If the projection lenses 5 to 9 have ideal imaging characteristics, the position of each projected image on the mask-side reference mark 10 matches the corresponding mark on the substrate-side reference mark 11.

Figure 4:
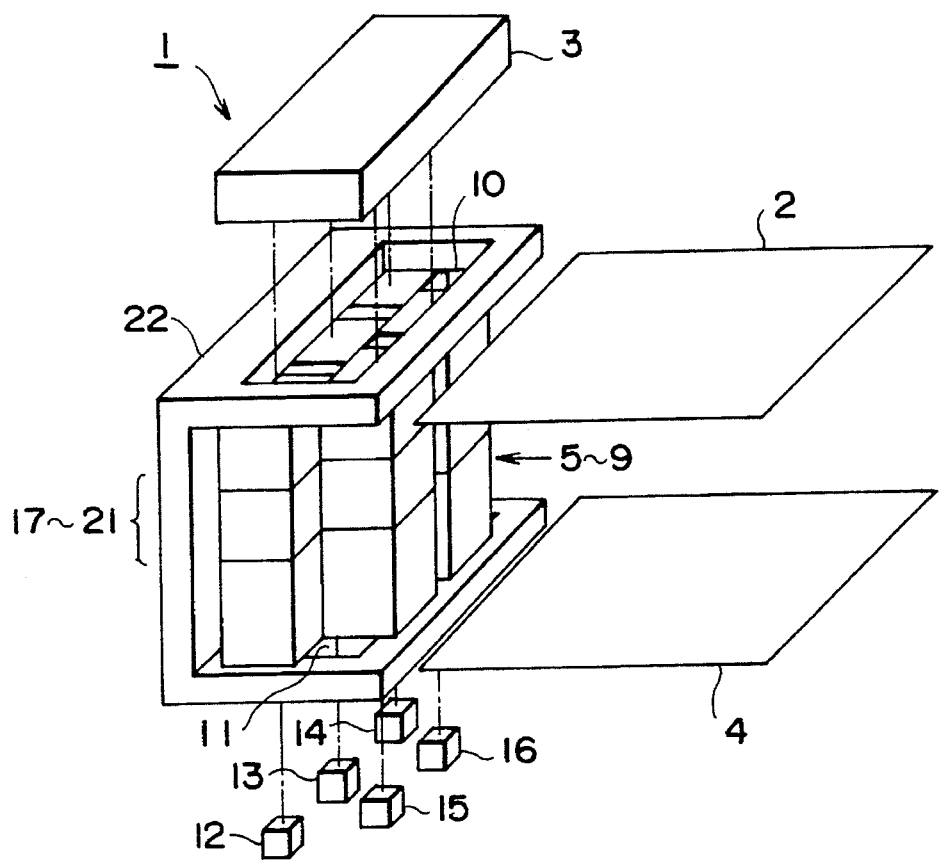
FIGS. 4 to 6 are views for explaining measurement of an error between the mask-side reference mark and the substrate-side reference mark.
Figure 5:
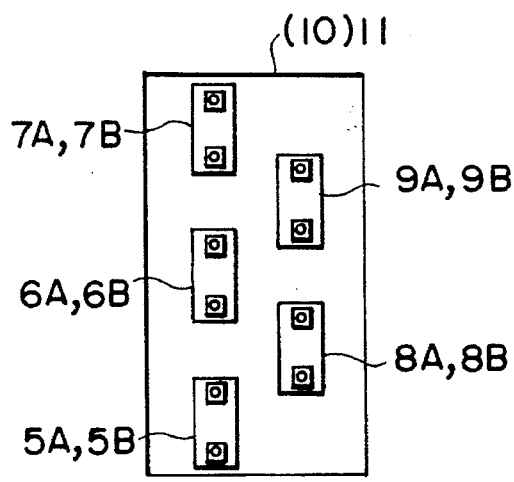

In the above arrangement, when the imaging characteristics of the projection lenses 5 to 9 are to be measured, the block 22 is moved in the direction indicated by the arrow a in FIG. 1 together with the mask 2 and the photosensitive substrate 4. As shown in FIG. 4, the mask-side reference mark 10 and the substrate-side reference mark 11 are respectively set on the incident side and on the exit side of the projection lenses 5 to 9. With this arrangement, an image of the mask-side reference mark 10 illuminated by the illumination system 3 is formed on the substrate-side reference mark 11 through the projection lenses 5 to 9. In this manner, the distance (displacement amount) between the obtained projected image of the mask-side reference mark 10 and the substrate-side reference mark 11 is measured by the measurement devices 12 to 16, as shown in FIG. 5.

Figure 6:
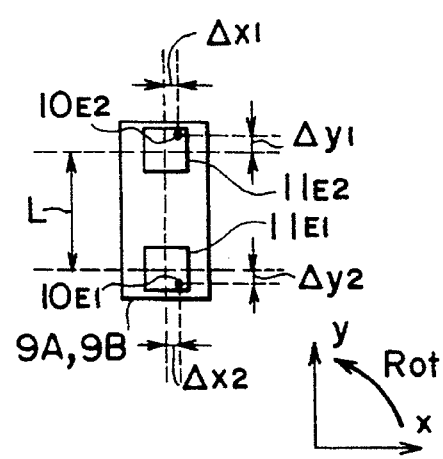

In each of the measurement devices 12 to 16, a TV camera or the like is arranged through a focusing optical system with an appropriate magnification. With this arrangement, the displacement amount between the projected image of the mask-side reference mark 10 and the substrate-side reference mark 11 can be easily calculated in accordance with the pixel pitch of the TV camera and the magnification of the optical system. In this measurement, for, e.g., at least the two marks $10_{E1}$, $10_{E2}$, $11_{E1}$, and $11_{E2}$ in the exposure areas 9A and 9B of one projection lens 9, amounts of displacement or displacement amounts $\Delta x_1, \Delta x_2, \Delta y_1, \Delta y_2, \ldots, \Delta x_n, \Delta y_n$ of the mask-side reference marks $11_{E1}$ and $11_{E2}$ with respect to the projected images of the substrate-side reference marks $10_{E1}$ and $10_{E2}$ are measured, as shown in FIG. 6 (n is the number of marks).

The most simple case wherein only two marks are used will be described below. As shown in FIG. 1, the alignment direction of the projection lenses 5 to 7 is defined as the Y direction and the scanning direction (arrow a) of the mask 2 and the photosensitive substrate 4 is defined as the X direction. The two marks are formed while being separated from each other by a distance L along the Y direction. The displacement amounts between the first marks $10_{E2}$ and $11_{E2}$ are represented by $\Delta x_1$ and $\Delta y_1$. The displacement amounts between the second marks $10_{E1}$ and $11_{E1}$ are represented by $\Delta x_2$ and $\Delta y_2$. The displacement amounts measured at this time are assumed to be mainly accounted for by errors generated by distortion in the projection lens 9. The correction values of the projection lens 9 are obtained by an arithmetic unit in accordance with the following equations:

$$\text{Mag} = \frac{\Delta y_2 - \Delta y_1}{L} \quad (1)$$

$$\text{Rot} = \tan^{-1}\left[\frac{\Delta x_1 - \Delta x_2}{L}\right] \quad (2)$$

$$\text{shift } x = -\frac{\Delta x_1 + \Delta x_2}{2} \quad (3)$$

$$\text{shift } y = -\frac{\Delta y_1 + \Delta y_2}{2} \quad (4)$$

Note that, as for the rotation amount (Rot) of an image, rotation from the X axis to the Y axis is represented by a positive value, as shown in FIG. 6.

Mag given by equation (1) above is the magnification correction value of the projected image, Rot given by equation (2) above is the rotation correction value, and shift x and shift y respectively given by equations (3) and (4) above are the image shift correction values. For all the projection lenses 5 to 9, these correction values are obtained in the same manner. The obtained correction values are sent to the lens adjustment mechanisms 17 to 21. The imaging characteristics of each of the projection lenses 5 to 9 can be corrected in accordance with at least one of the magnification correction value (Mag), the image rotation correction value (Rot), and the image shift correction values (shift x and shift y).

According to the above arrangement, an image of the mask-side reference mark 10 arranged on the mask surface is formed on the substrate-side reference mark 11 arranged on the photosensitive substrate surface through the corresponding one of the projection lenses 5 to 9. The displacement amount between the projected image of the mask-side reference mark 10 and the substrate-side reference mark 11 is directly measured. The projection lenses 5 to 9 are adjusted and optimized to minimize the corresponding displacement amounts, thereby appropriately correcting the imaging characteristics of the projection lenses 5 to 9. Therefore, any error in projected image, which is generated in actual exposure, can be minimized. In this manner, the mask 2 and the photosensitive substrate 4 are synchronously scanned with respect to the plurality of projection lenses 5 to 9, thereby properly transferring the entire pattern area on the mask 2 onto the photosensitive substrate 4.

According to the above arrangement, the mask-side reference mark 10 and the substrate-side reference mark 11 are attached to the block 22 with a high rigidity and always arranged in the exposure apparatus 1. Measurement can be performed any time as needed. Even if the imaging characteristics change with time, the projection lenses 5 to 9 can be always adjusted to minimize any displacement amounts.

Figure 7:
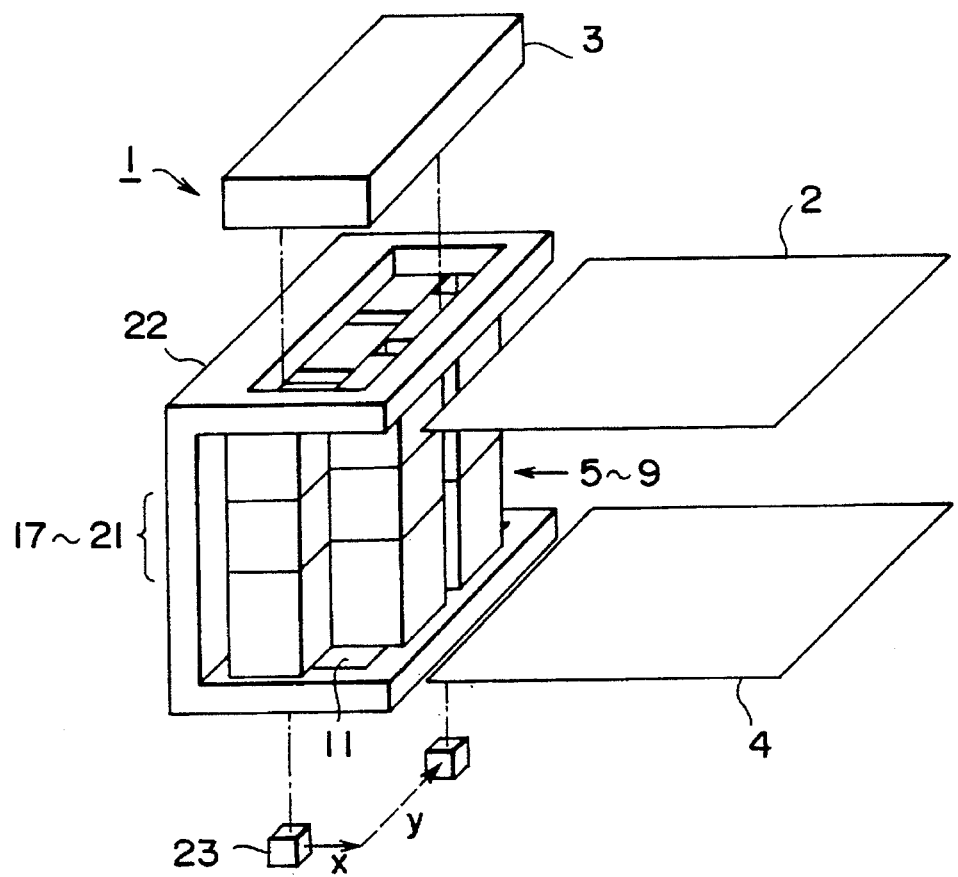
FIG. 7 is a perspective view showing an apparatus having only one measurement device.

In the above embodiment, the measurement devices 12 to 16 are arranged in correspondence with the projection lenses 5 to 9. However, the present invention is not limited to this particular arrangement. As shown in FIG. 7, only one measurement device 23 may be arranged and positioned under each of the projection lenses 5 to 9 by a moving mechanism.

Figure 8:
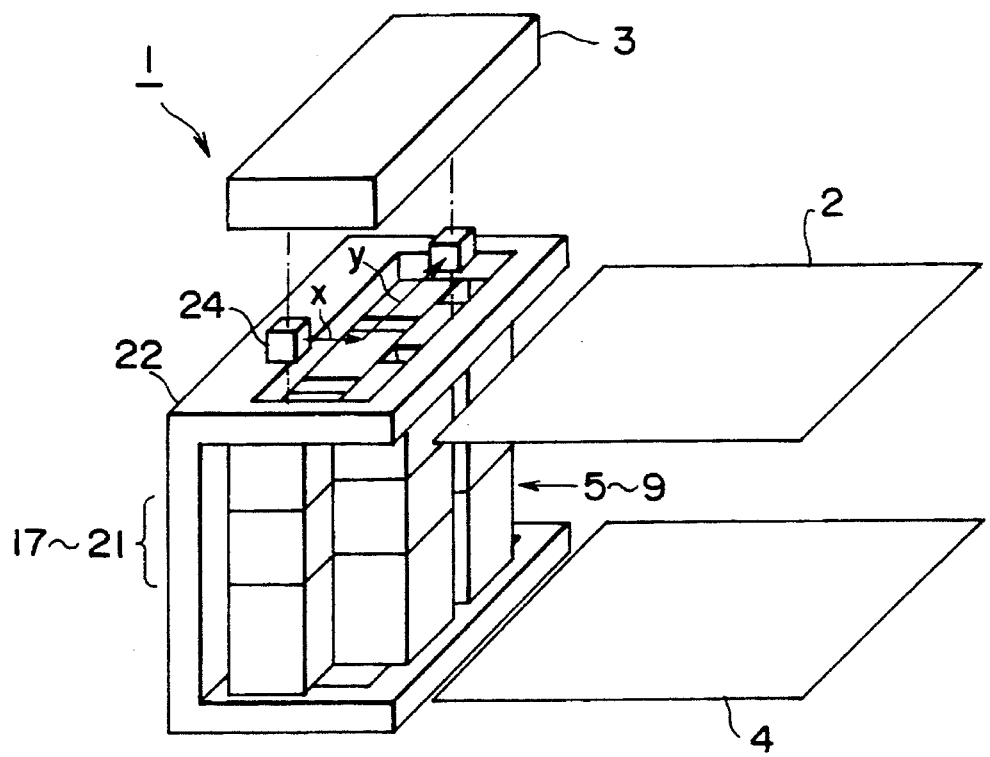
FIGS. 8 and 9 are views showing an apparatus having only one measurement device between a mask surface and an illumination system.
Figure 9:
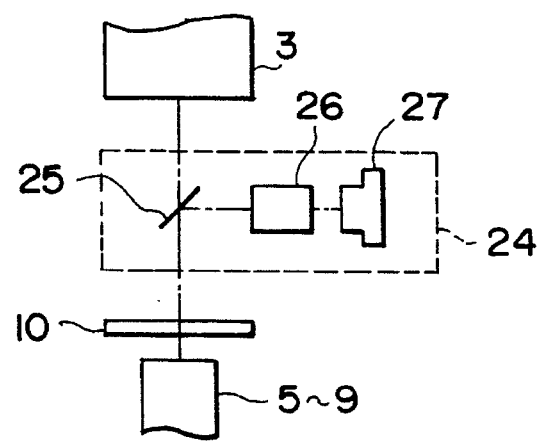

In the above embodiment, the plurality of measurement devices 12 to 16 are arranged on the opposite side of the projection lenses 5 to 9 with respect to the photosensitive substrate surface. Instead, as shown in FIGS. 8 and 9, only one measurement device 24 having a moving mechanism as in FIG. 7 may be arranged between the mask surface and the illumination system 3. In this case, the substrate-side reference mark 11 forms an image on the mask-side reference mark 10 through the projection lenses 5 to 9. When the displacement amount between the image of the substrate-side reference mark 11 and the mask-side reference mark 10 is measured, correction values can be obtained as in the above embodiment.

In this case, since the imaging characteristics of the projection lenses 5 to 9 act on the image of the substrate-side reference mark 11, the signs of the obtained correction values are reversed. The measurement device 24 can be constituted by a half mirror 25, a focusing lens 26, and a CCD camera 27, as shown in FIG. 9 and positioned on the projection lenses 5 to 9 as needed.

Second Embodiment

Figure 10:
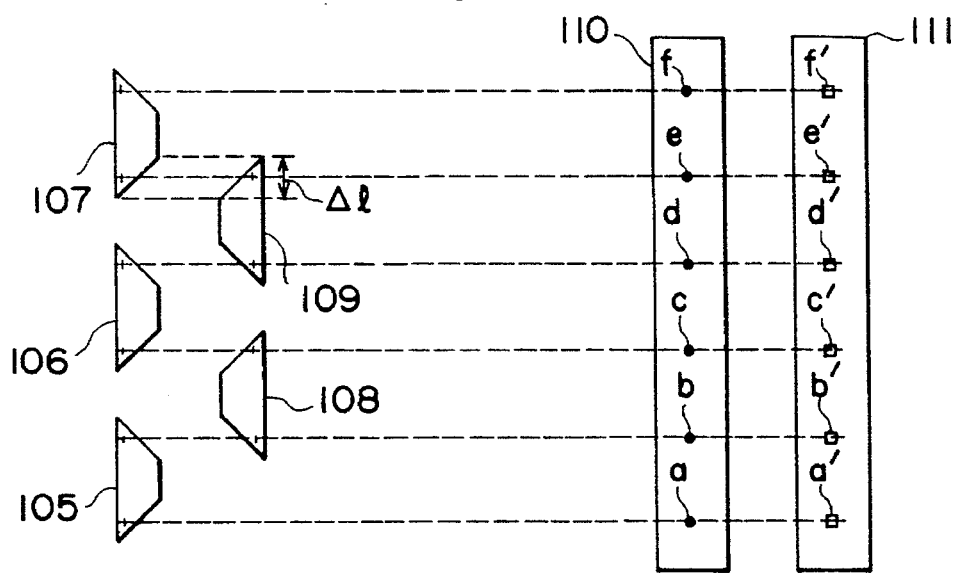
FIG. 10 is a view showing the arrangement of the mask-side reference mark and the substrate-side reference mark.

The second embodiment will be described below. As shown in FIG. 10, a mask-side reference mark 110 and a substrate-side reference mark 111 respectively have a plurality of marks a to f and a' to f' aligned in lines in correspondence with each other. Of projection lenses 5 to 9 aligned in two lines, the first-line projection lens 5 to 7 respectively have exposure areas 105 to 107 each including two marks. Since the projection lenses 5 to 9 are arranged in a staggered manner, each of exposure areas 108 and 109 of the second-line projection lenses 8 and 9 also has two marks.

Figure 11:
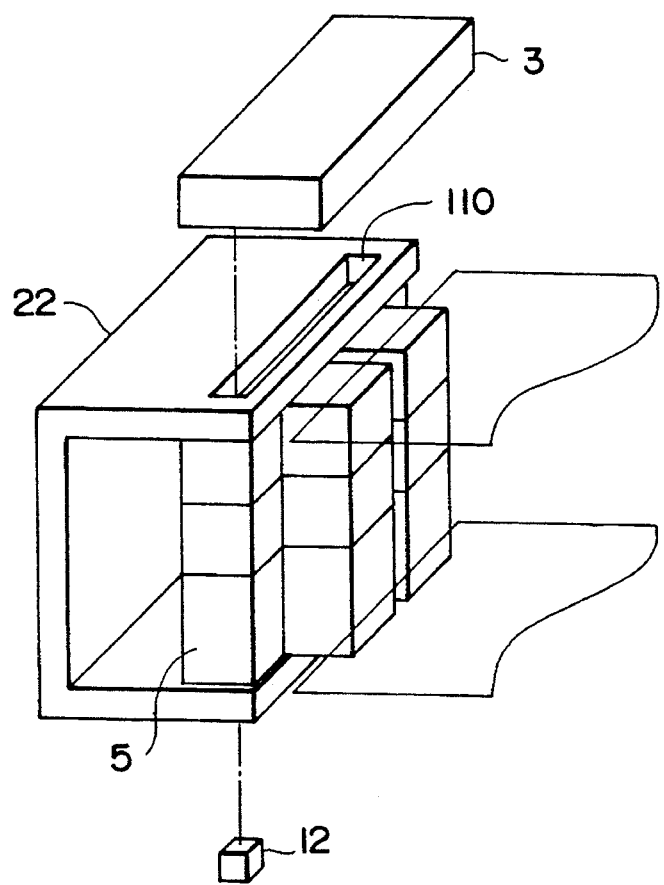
FIGS. 11 and 12 are perspective views showing the positional relationships of projection lenses with respect to exposure areas during calibration.
Figure 12:
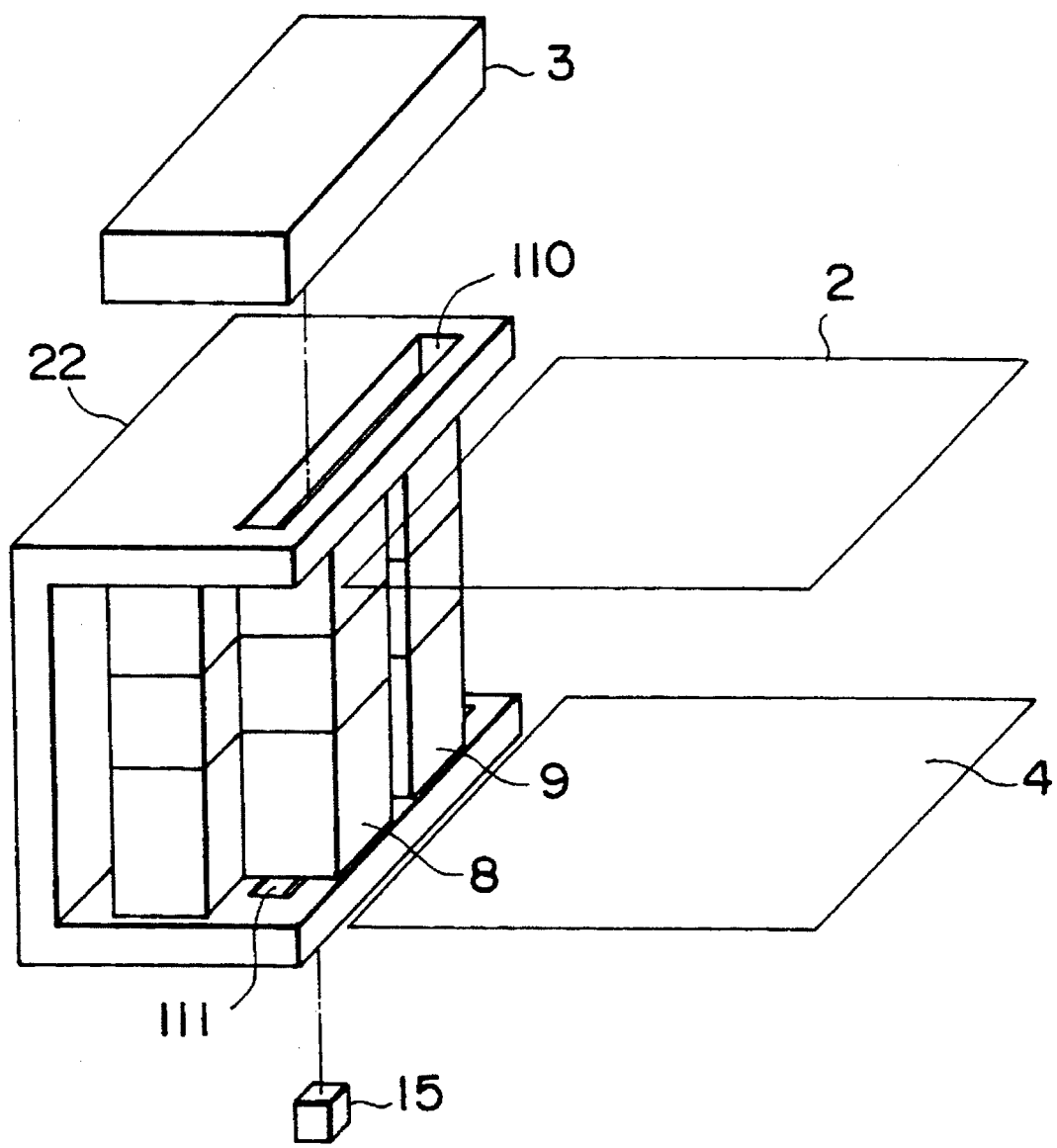

As shown in FIG. 11 and 12, a block 22 is moved in a direction indicated by an arrow a together with a mask 2 and a photosensitive substrate 4, thereby setting the mask-side reference mark 110 and the substrate-side reference mark 111 on the incident side and the exit side of the projection lenses 5 to 9, respectively. Referring to FIG. 11, an image of the mask-side reference mark 110 is formed on the substrate-side reference mark 111 by a light beam projected from an illumination system 3 through the first-line projection lenses 5 to 7. The displacement amounts between the formed projected images and the substrate-side reference mark are measured by measurement devices 12 to 14. Thereafter, as shown in FIG. 12, the block 22 is moved in the direction indicated by the arrow a together with the mask 2 and the photosensitive substrate 4. Another image of the mask-side reference mark 110 is formed on the substrate-side reference mark 111 by the light beam projected from the illumination system 3 through the second-line projection lenses 8 and 9. The displacement amounts between the projected images and the substrate-side reference mark are measured by measurement devices 15 and 16.

Figure 13:
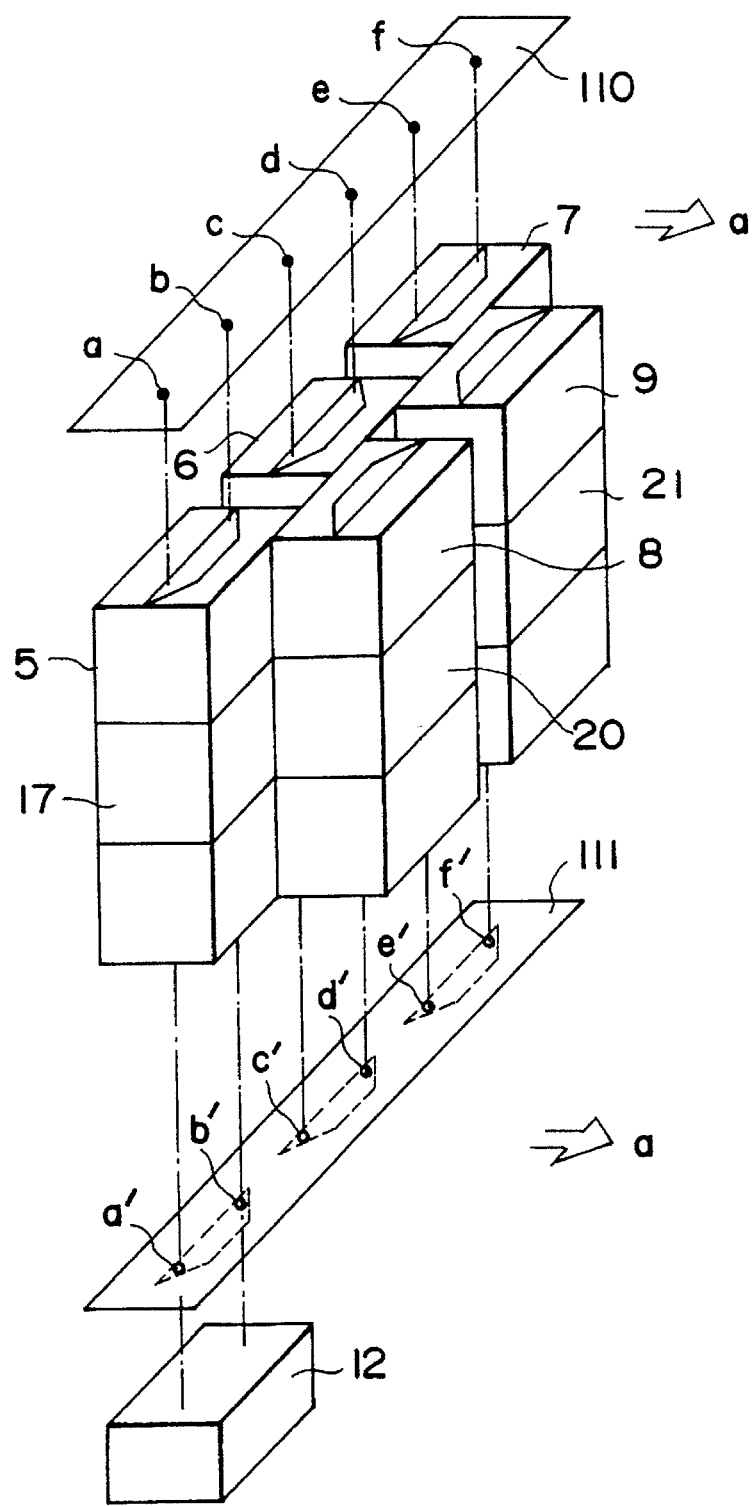
FIG. 13 is a perspective view showing calibration of first-line projection lenses.
Figure 14:
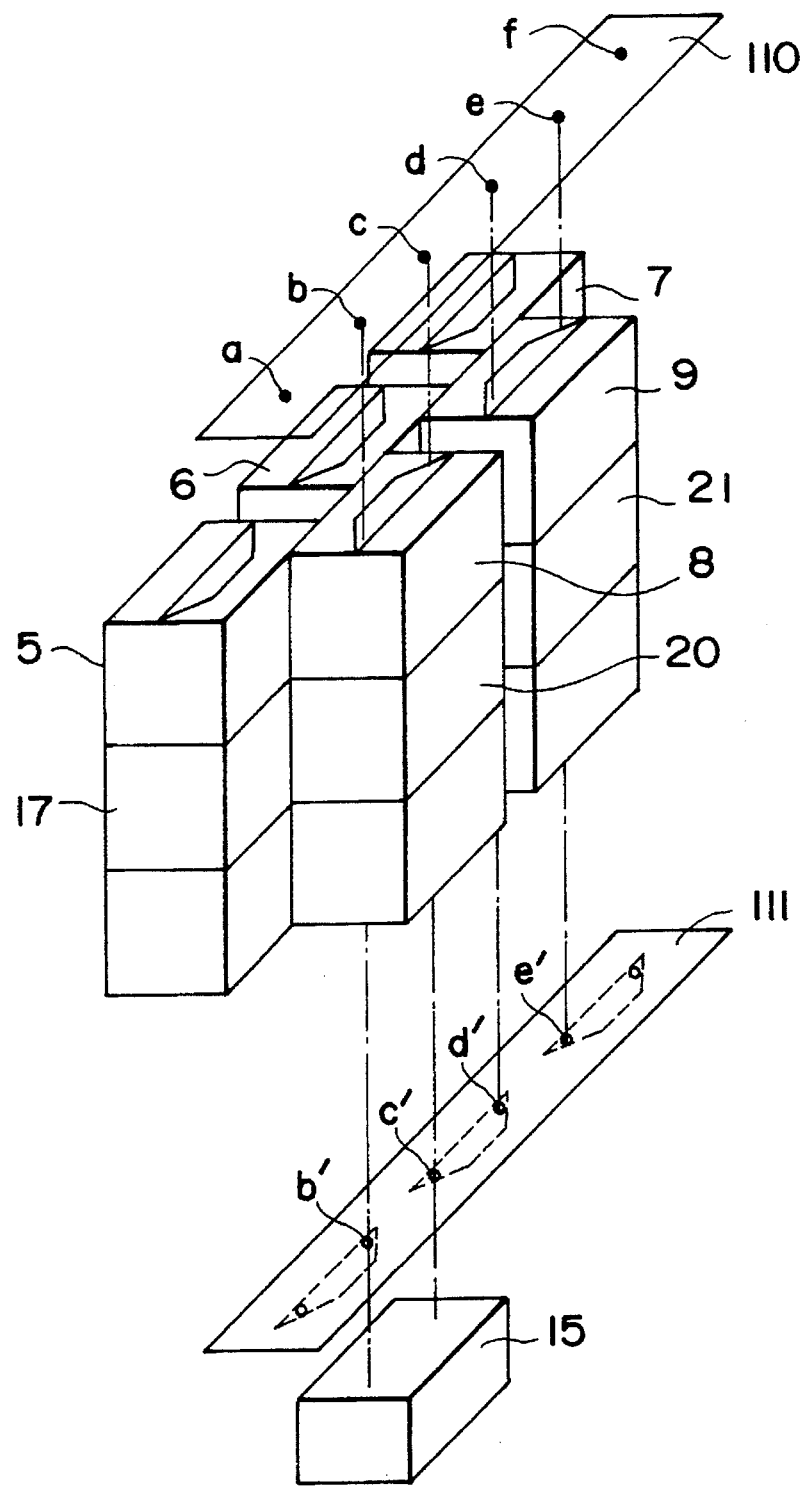
FIG. 14 is a perspective view showing calibration of second-line projection lenses.
Figure 15:
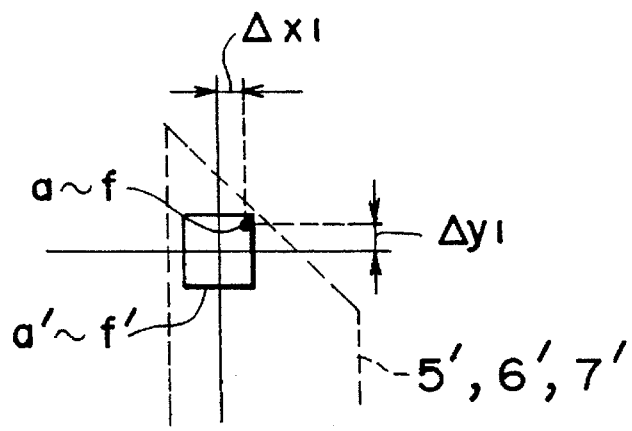
FIGS. 15 and 16 are views showing the displacement amounts between the mask-side reference mark and the substrate-side reference mark.

FIGS. 13 and 14 are views showing measurement of the first-line and second-line projection lenses with the above arrangement shown in FIGS. 11 and 12. As shown in FIG. 13, when the first-line projection lenses 5 to 7 are to be calibrated, light beams are projected from the illumination system 3 to form images of the marks a to f on the mask-side reference mark 110 onto the substrate-side reference mark 111 through the projection lenses 5 to 7. Displacement amounts $\Delta x_1$ and $\Delta y_1$ between the projected images of the marks a to f and the corresponding marks a' to f' on the substrate-side reference mark 111 are measured by the measurement devices 12 to 14, respectively, as shown in FIG. 15. The measured displacement amounts $\Delta x_1$ and $\Delta y_1$ are adjusted by lens adjustment mechanisms 17 to 19 in accordance with the magnifications of the projection lenses 5 to 7, and the rotations and shifts of the projected images such that squares of $\Delta x_1$ and $\Delta y_1$ are minimized.

Figure 16:
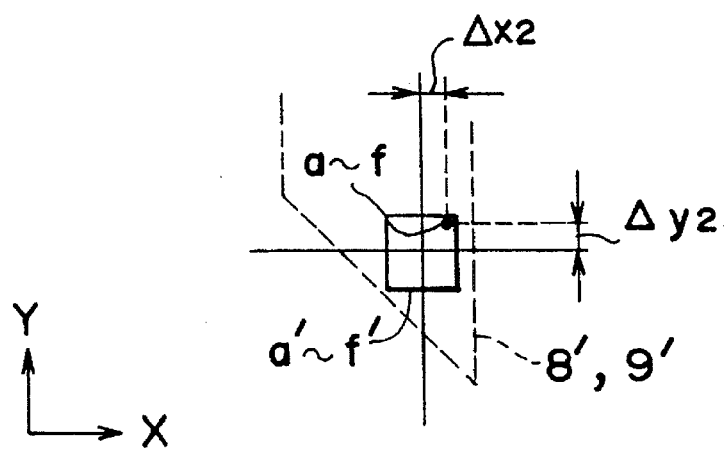

The block 22 is moved in the direction indicated by the arrow a together with the mask 2 and the photosensitive substrate 4 to calibrate the second-line projection lenses 8 and 9. As shown in FIG. 14, as in calibration of the first-line projection lenses 5 to 7, light beams are projected from the illumination system 3 to the second-line projection lenses B and 9, thereby forming images of the marks b to e on the mask-side reference mark 110 onto the substrate-side reference mark 111 through the projection lenses 8 and 9. At this time, displacement amounts $\Delta x_2$ and $\Delta y_2$ between the projected images of the marks b to e and the corresponding marks b' to e' on the substrate-side reference mark 111 are measured by the measurement devices 15 and 16, as shown in FIG. 16. The image rotations and shifts, and the magnifications of the projection lenses 8 and 9 are adjusted by lens adjustment mechanisms 20 and 21.

According to the above arrangement, the mask-side reference mark 110 and the substrate-side reference mark 111 are arranged at positions corresponding to the mask 2 and the photosensitive substrate 4, respectively. The same marks in the reference marks are used to measure the displacement amounts of the images of the marks at positions corresponding to overlapping portions of the projected images of the first-line projection lenses 5 to 7 and the second-line projection lenses 8 and 9, thereby adjusting the imaging characteristics of the projection lenses. In this manner, any adjustment error in the projection lens, which is caused by the manufacturing error in the mask-side reference mark 110 or the substrate-side reference mark 111, or the attachment error to the block 22, can be equalized for the overlapping portions of the plurality of projection lenses. As a result, the imaging characteristics of the projection lenses can be adjusted such that the exposure images projected onto the photosensitive substrate 4 are continuously formed at the connecting portions.

In the above embodiment, both the first-line projection lenses 5 to 7 and the second-line projection lenses 8 and 9 are adjusted such that squares of the displacement amounts $\Delta x$ and $\Delta y$ are minimized. However, the present invention is not limited to this specific detail. For example, after calibration of the first-line projection lenses, first-line displacement amounts $\Delta x_1'$ and $\Delta y_1'$ are measured again. Subsequently, the second-line displacement amounts $\Delta x_2$ and $\Delta y_2$ are measured, and the second-line projection lenses may be adjusted such that values $|\Delta x_2 - \Delta x_1'|$ and $|\Delta y_2 - \Delta y_1'|$ are minimized. In this case, since the measured second-line displacement amounts include any residual error in the adjusted first-line optical systems, the residual error in the first line does not affect image displacement amounts.

In the second embodiment, the number and arrangement of the marks 110 and 111 are set as shown in FIG. 10. However, the present invention is not limited to this. The number and arrangement of the mask-side reference mark 110 and the substrate-side reference mark 111 only need to correspond to those of the projection lenses.

Third Embodiment

Figure 17:
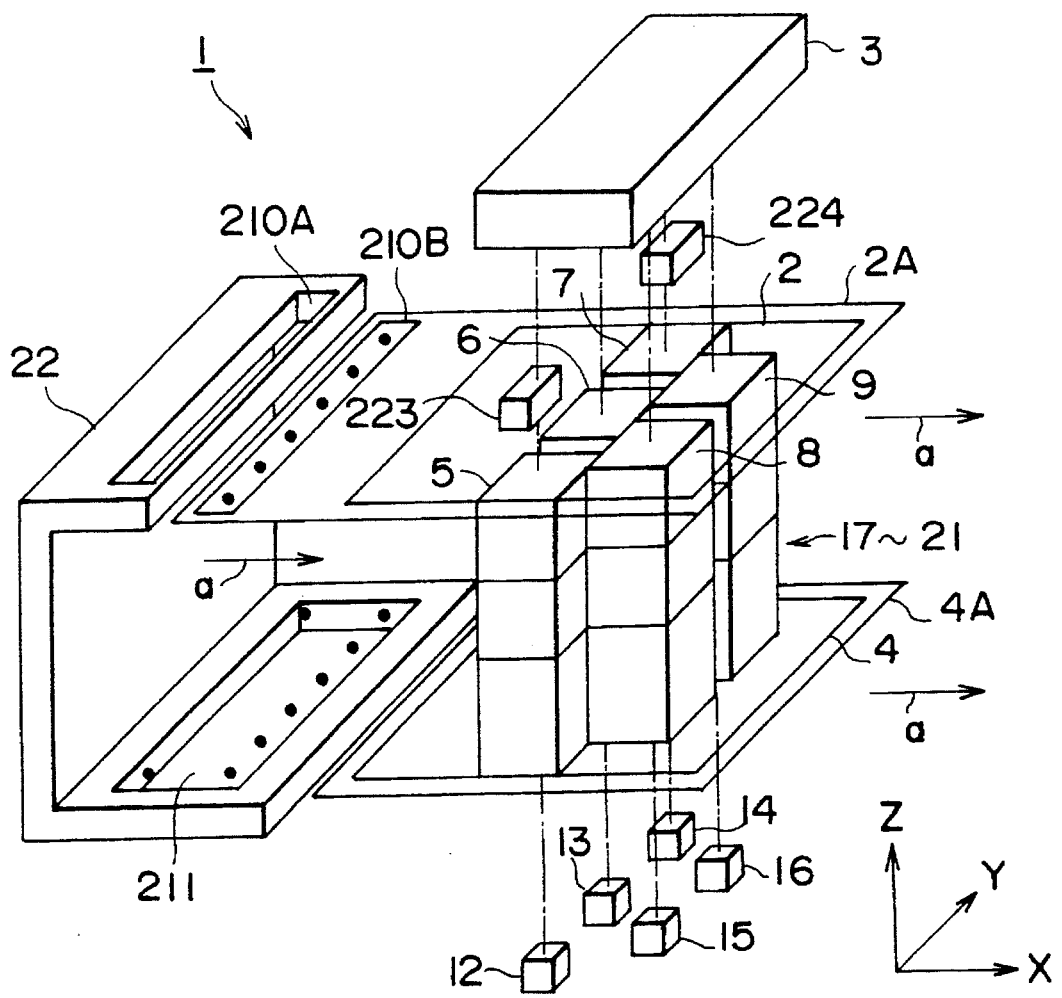
FIG. 17 is a perspective view schematically showing a scanning exposure apparatus according to the third embodiment.

The third embodiment will be described below. In the third embodiment, as shown in FIG. 17, as a mask-side reference mark 210 and a substrate-side reference mark 211, the substrate-side reference mark 211 and a mask-side fixed mark 210A are attached to a block 22. A mask-side movable mark 210B is attached to a mask stage 2A mounted with a mask 2. The mask stage 2A, a photosensitive substrate holder 4A mounted with a photosensitive substrate 4, and the block 22 are attached to a carriage and integrally moved with respect to an illumination system 3 and projection lenses 5 to 9.

A moving mechanism (not shown) is attached to the mask stage 2A to move it in the X, Y, and θ directions with respect to the block 2 and the photosensitive substrate holder 4A. A laser interferometer (not shown) is provided to monitor the position of the mask stage 2A with respect to the photosensitive substrate holder 4A. Alignment microscopes 223 and 224 for measuring the displacement amount between an image of an alignment mark on the photosensitive substrate 4, which is formed on the mask 2 through the projection lenses 5 and 7, and an alignment mark on the mask 2 are arranged between the outermost projection lenses 5 and 7 under the illumination system 3. These alignment microscopes 223 and 224 are set to have a relatively wide field and commonly used as an observation system in calibration of the mask-side reference mark 210 and the substrate-side reference mark 211.

Figure 18:
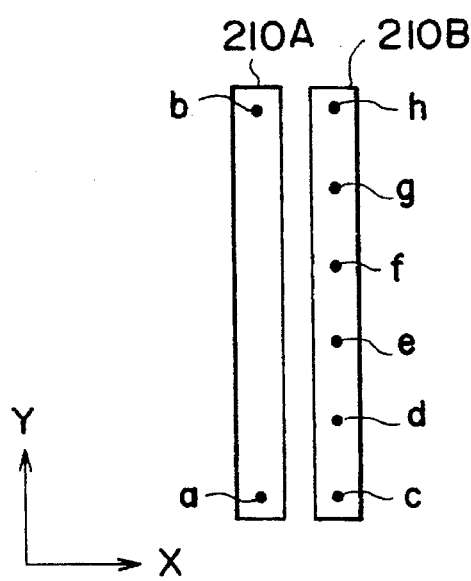
FIGS. 18 and 19 are views showing the arrangements of a mask-side reference mark and a substrate-side reference mark.
Figure 19:
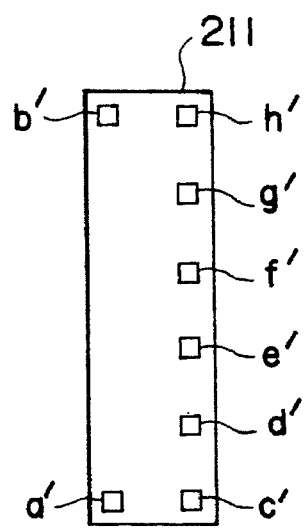

FIGS. 18 and 19 are views showing the mask-side reference mark 210 and the substrate-side reference mark 211, respectively. Of the mask-side reference mark 210 (FIG. 18), the mask-side fixed mark 210A fixed to the block 22 is formed such that the exposure area of each of the outermost projection lenses 5 and 7 has at least one measurement mark a or b. The mask-side movable mark 210B is formed such that the exposure area of each of the projection lenses 5 to 9 has at least two of measurement marks c to h. For the substrate-side reference mark 211 corresponding to the mask-side reference mark 210, measurement marks a' to h' are precisely formed in correspondence with the measurement marks a to h of the mask-side fixed mark 210A and the mask-side movable mark 210B.

Figure 20:
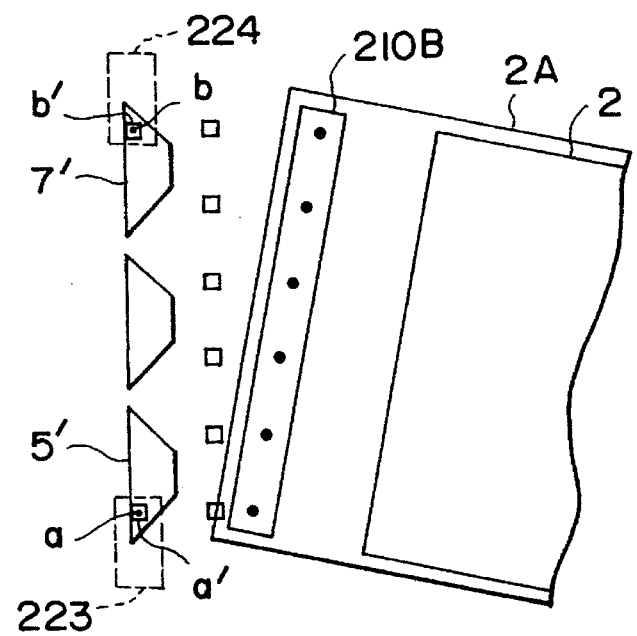
FIGS. 20 to 22 are views for explaining calibration of the end projection lenses by using a mask-side fixed mark.
Figure 21:
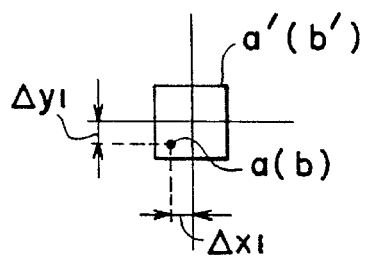
Figure 22:
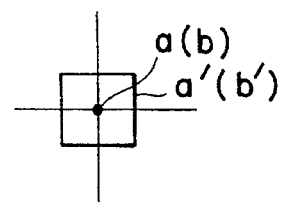

FIGS. 20 to 22 are views for explaining calibration of the outermost projection lenses 5 and 7 by using the substrate-side reference mark 211 and the mask-side fixed mark 210A. The carriage is moved with respect to the projection lenses 5 and 7 until the measurement mark a of the mask-side fixed mark 210A and the measurement mark a' of the substrate-side reference mark 211 are conjugate with each other. The measurement mark a' is projected on the measurement mark a through the projection lens 5. As shown in FIG. 21, displacement amounts $\Delta x_1$ and $\Delta y_1$ between the projected image and the measurement mark a are measured by the alignment microscope 223. As shown in FIG. 22, the image of the measurement mark a' is moved, e.g., image-shifted by a lens adjustment mechanism 17 of the projection lens 5 such that the displacement amounts $\Delta x_1$ and $\Delta y_1$ become zero. In the same manner, the projection optical system 7 is adjusted by the alignment microscope 224 and the measurement marks b and b'.

Figure 23:
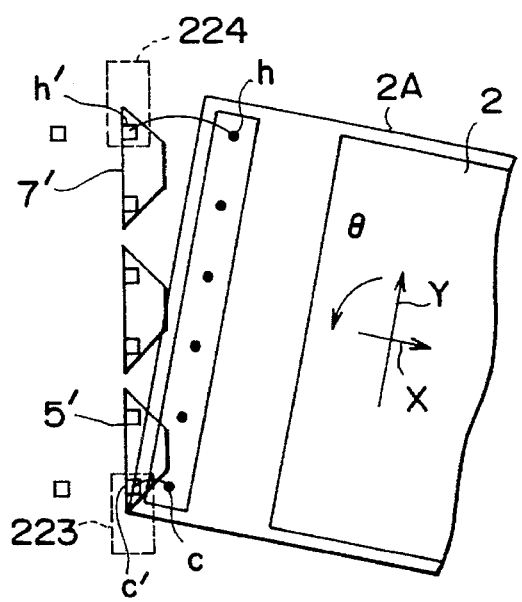
FIG. 23 is a view for explaining calibration of a mask-side movable mark.
Figure 24:
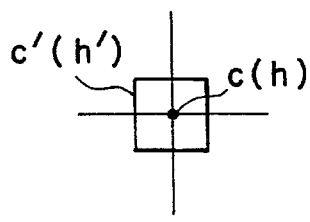
FIGS. 24 and 25 are views for explaining calibration of the mask-side movable mark.
Figure 25:
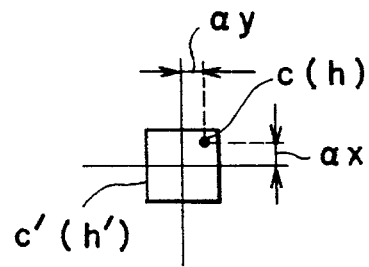

Subsequently, calibration of the mask-side movable mark 210B is performed, as shown in FIGS. 23 to 25. More specifically, the carriage is moved with respect to the projection lens 5 such that the measurement mark c of the mask-side movable mark 210B and the measurement mark c' of the substrate-side reference mark 211 are conjugate with each other. At this time, the carriage is moved with respect to the projection lens 7 such that the measurement mark h of the mask-side movable mark 210b and the measurement mark h' of the substrate-side reference mark 211 become conjugate with each other. The measurement marks a and c are preferably located at the same position or almost the same position along the Y direction in FIG. 18. This also applies to the measurement marks b and h.

The measurement mark c' is projected on the measurement mark c through the projection lens 5 which is already adjusted by the measurement mark a. Displacement amounts $\Delta x_2$ and $\Delta y_2$ between the projected image and the measurement mark c are measured by the alignment microscope 223. In the same manner, displacement amounts $\Delta x_3$ and $\Delta y_3$ between the measurement marks h and h' are measured. The mask stage 2A is moved in the X, Y, and θ directions such that the displacement amounts $\Delta x_2$, $\Delta y_2$, $\Delta x_3$, and $\Delta y_3$ are minimized.

In this manner, the displacement amounts between the measurement marks c and c', and h and h' are eliminated by moving the mask stage 2A, as shown in FIG. 24. However, if an error is present with respect to the design value of attachment of the mask-side fixed mark 210A and the substrate-side reference mark 211 to the block 22 (i.e., in this case, even when the mask-side fixed mark 210A and substrate-side reference mark 211 two-dimensionally match each other, the image of the mask-side fixed mark 210A does not match the substrate-side reference mark 211 through the projection optical system (having the best imaging characteristics)), the error is included in the position of the mask-side movable mark 210B. Therefore, if an error is present, error amounts αx and αy of the substrate-side reference mark 211 with respect to the mask-side fixed mark 210A are measured in advance, and the error amounts αx and αy are added in movement of the mask stage 2A, as shown in FIG. 25.

Figure 26:
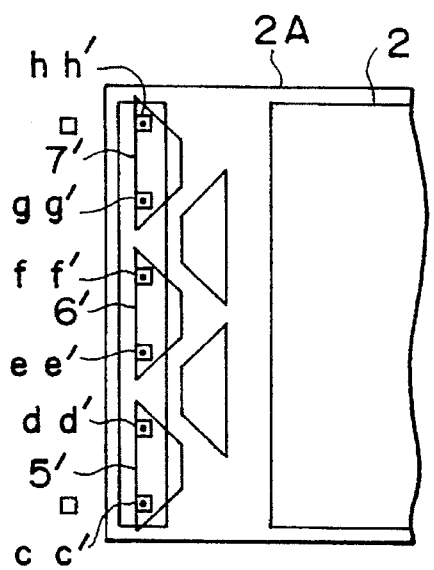
FIGS. 26 and 27 are views for explaining adjustment of projection lenses by using the mask-side movable mark and the substrate-side reference mark.
Figure 27:
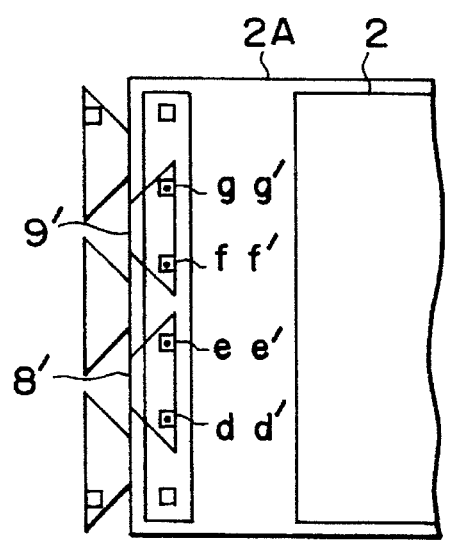

Calibration of the mask-side movable mark 210B as a reference is completed in this manner. Subsequently, calibration of the projection lenses 5 to 9 is performed, as shown in FIGS. 26 and 27. At this time, not only for the projection lenses 6, 8, and 9 but also for the outer projection lenses 5 and 7, the displacement amounts between the measurement marks c to h of the calibrated mask-side movable mark 210B and the measurement marks c' to h' of the substrate-side reference mark 211 are measured by measurement devices 12 to 16, thereby performing calibration on the basis of the displacement amounts as measurement results.

According to the above arrangement, the positions of the measurement marks c' to h° of the substrate-side reference mark 211 as a reference and the positions of the measurement marks c to h of the mask-side movable mark 210B are calibrated before calibration of the projection lenses 5 to 9. For this reason, the projection lenses 5 to 9 can be precisely calibrated. Therefore, by synchronously scanning the mask 2 and the photosensitive substrate 4 with respect to the plurality of projection lenses 5 to 9, the entire surface pattern area on the mask 2 can be properly transferred onto the photosensitive substrate 4. In addition, according to the above arrangement, the attachment precision of the substrate-side reference mark 211 and the mask-side fixed mark 210A to the block 22, or the mask-side movable mark 210B to the mask stage 2A need not be accurately controlled, and manufacturing is facilitated accordingly.

In the above embodiment, the error amounts αx and αy between the measurement marks a and b of the mask-side fixed mark 210A and the measurement marks a' and b' of the substrate-side reference mark 211, i.e., the attachment size is measured in advance. Instead, even when error amounts αx and αy are set to zero to perform calibration in advance, and actual error amounts αx and αy are finally calculated as offset amounts by exposure, the same effect as in the above embodiment can be realized.

In the above embodiment, the alignment microscopes 223 and 224 are used to calibrate the substrate-side reference mark 211 and the mask-side movable mark 210B, and the dedicated measurement devices 12 to 16 are used to calibrate the projection lenses 5 to 9. However, a common sensor may also be used. In this case, when a sensor having a mechanism for switching the observation system to a wide field or switching to a high resolving power is used, the same effect as in the above embodiment can be realized.

In each of the above embodiments, the present invention is applied to a scanning exposure apparatus having five projection lenses. However, the number of projection lenses can be freely set. As for the projection lens, a projection optical system using a reflecting mirror may also be used as far as an image of the mask surface is formed on the photosensitive substrate. Either a reduction or enlargement projection optical system can realize the same effect as in the above embodiment.

Fourth Embodiment

Figure 28:
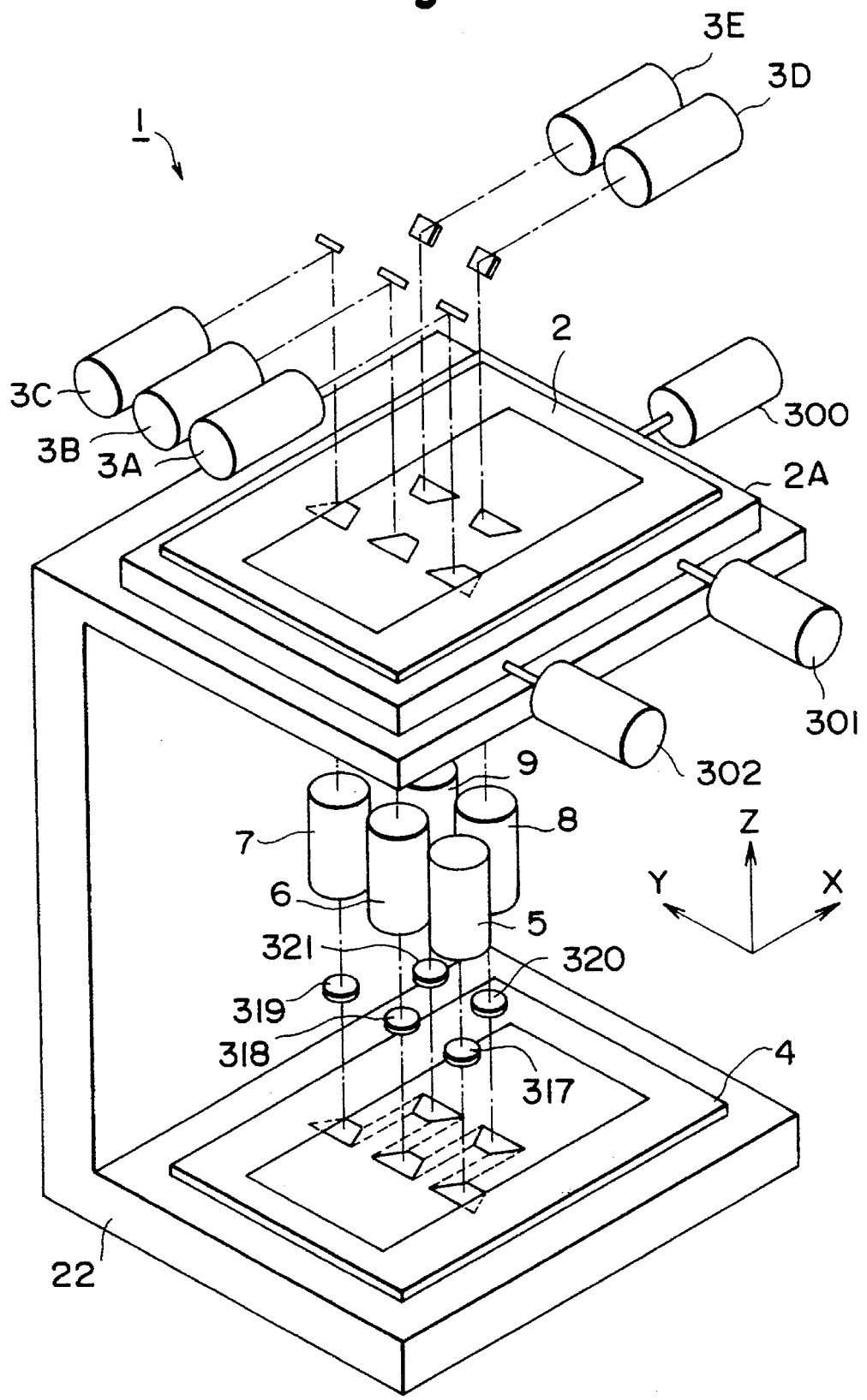
FIG. 28 is a perspective view showing the overall arrangement of an exposure apparatus according to the fourth embodiment of the present invention.

FIG. 28 is a perspective view showing the overall arrangement of an exposure apparatus of the present invention. The same reference numerals as in the first to third embodiment denote the same constituent elements in this embodiment.

Referring to FIG. 1 or 8, the single illumination system 3 corresponds to the projection lenses 5 to 9. In FIG. 28, however, illumination systems 3A to 3E are respectively provided in correspondence with projection lenses 5 to 9. Actuators 300 to 302 are arranged to move a mask stage 2A with respect to a block 22. When the actuator 300 is driven, the mask stage 2A is moved in the X direction. The mask stage 2A is moved in the Y direction in accordance with the average driving amount of the actuators 301 and 302, and is rotated about the Z axis by an amount corresponding to the difference between the actuators 301 and 302. Lens adjustment mechanisms 317 to 321 are arranged under the projection lenses 5 to 9, respectively.

Fifth Embodiment

Figure 29:
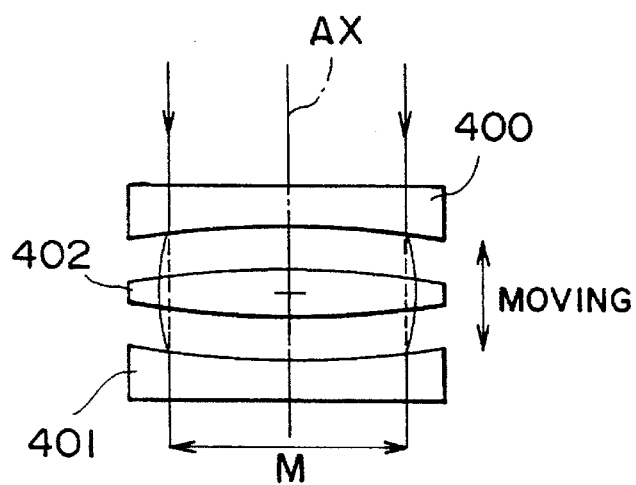
FIGS. 29 and 30 are views showing a mechanism for adjusting the magnification of a projection lens.
Figure 30:
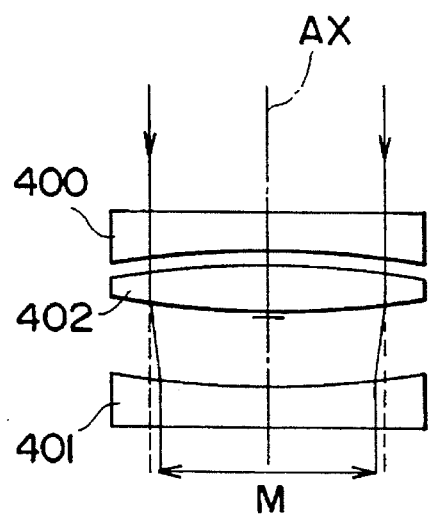

The arrangement of the lens adjustment mechanism will be described below. FIG. 29 is a view showing an example of the adjustment mechanism of the magnification of a projection lens. This mechanism is constituted by two concave lenses 400 and 401, and a convex lens 402 movably arranged between the lenses 400 and 401. In FIG. 29, the convex lens 402 is arranged at the middle position between the concave lenses 400 and 401, so the projection magnification does not change, and an image size M does not change, either. When the convex lens 402 is moved close to the concave lens 400, as shown in FIG. 30, the image size M becomes larger. In both the cases, the position of an optical axis AX does not change.

Figure 31:
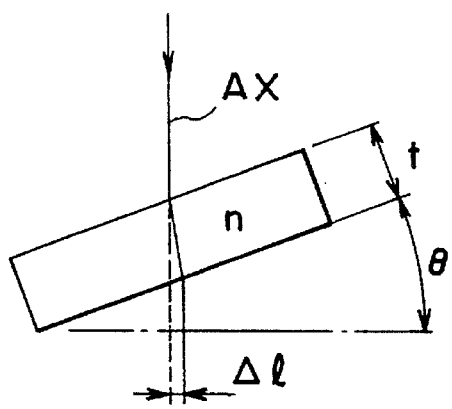
FIG. 31 is a view showing an image shift adjustment mechanism.

FIG. 31 is a view showing an image shift adjustment mechanism. This mechanism is constituted by a single parallel plate located in the optical path. When this parallel plate is inclined as shown in FIG. 31, the position of the optical axis AX is shifted by $\Delta l$. The shift amount $\Delta l$ is represented by the following equation (4):

$$\Delta l = (1 - 1/n)t\theta \qquad (4)$$

where n is the refractive index of the material, t is the thickness, and θ is the inclination angle all of the parallel plate.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No.215310/1994, 215311/1994 and 215312/1994 all filed on Aug. 16, 1994 are hereby incorporated by reference.

What is claimed is:

1. An exposure apparatus comprising:
   an illumination optical system for illuminating a plurality of partial areas of a mask;
   a plurality of projection optical systems for projecting images onto a photosensitive substrate, the light beam passing through each of said partial areas of said mask being partially overlapping;
   a scanning mechanism for synchronously scanning said mask and said photosensitive substrate with respect to said projection optical systems in a predetermined direction;
   mask reference marks arranged on a surface corresponding to said mask surface;
   substrate reference marks arranged on a surface corresponding to said photosensitive substrate surface according to said mask reference marks;
   a displacement amount measurement unit for measuring a displacement between an image of one of said mask reference mark and said substrate reference mark, which image is formed through said projection optical system, and the other of said mask reference mark and said substrate reference mark; and
   a lens adjustment mechanism for correcting imaging characteristics of at least one of said projection optical system in accordance with the displacement amount measured by said displacement amount measurement unit.

2. An apparatus according to claim 1, wherein the image of said mask reference mark is projected near said substrate reference mark, and said displacement amount measurement unit measures the displacement amount between the position of said image and the position of said substrate reference mark.

3. An apparatus according to claim 1, wherein the image of said substrate reference mark is projected near said mask reference mark, and said displacement amount measurement unit measures the displacement amount between the position of said image and the position of said mask reference mark.

4. An apparatus according to claim 1, wherein said plurality of mask reference marks and said plurality of substrate reference marks are arranged on a block having a sufficient rigidity.

5. An apparatus according to claim 1, wherein correction values for adjusting at least one of projection magnifications of said projection optical systems, and rotations and shifts of the projected images through said projection optical systems are obtained based on the displacement amount measured by said displacement amount measurement unit, said correction values minimizing distortions in the projected images,
   and wherein said lens adjustment mechanism changes the imaging characteristics of said projection optical systems by changing at least one of the magnifications of said plurality of projection optical systems, and the rotations and shifts of the projected images.

6. An apparatus according to claim 1, wherein said mask reference marks are arranged in areas images of which are overlapping each other,
   and wherein said substrate reference marks are arranged in image areas overlapping each other.

7. An apparatus according to claim 6, wherein the displacement amount at the overlapping positions of said plurality of projection optical systems is measured using the same reference mark.

8. An apparatus according to claim 1, wherein said mask reference marks comprise mask first reference marks and mask second reference marks, and said substrate reference marks comprise substrate first reference marks and substrate second reference marks,
   said mask first reference marks and said substrate first reference marks are arranged at positions corresponding to said projection optical systems arranged at both ends, and
   one of said mask first reference mark and said mask second reference mark is fixed and the other is movable.

9. An apparatus according to claim 8, wherein said mask first reference marks and said substrate first reference marks are arranged on a block having a sufficient rigidity, and
   said mask second reference marks are formed on a mask stage supporting said mask.

10. An exposure method for exposing a photosensitive substrate by a plurality of projection optical systems, a plurality of light beams passing through a plurality of partial areas of a mask being partially overlapping, comprising:
    a step of measuring a displacement between an image of one of a mask reference mark formed on a surface corresponding to said mask surface according to the overlapping part of said light beams and a substrate reference mark formed on a surface corresponding to said photosensitive substrate surface according to the overlapping part of said light beams, which image is formed through said projection optical system, and the other of said mask reference mark and said substrate reference mark; and
    a step of correcting said displacement.

11. An exposure method according to claim 10, wherein an imaging characteristics of at least one of said plurality of projection optical systems is corrected in said step of correcting.

12. An exposure method according to claim 11, wherein said correcting of said imaging characteristics includes at least one of a projection magnification correction, a shifting correction and a rotation correction.

13. An exposure method for exposing a photosensitive substrate by a plurality of projection optical systems, a plurality of light beams passing through a plurality of partial areas of a mask being partially overlapping, comprising:
    a step of measuring a first displacement between an image of one of a first mask reference mark formed on a surface corresponding to said mask surface according to the overlapping part of said light beams and a first substrate reference mark formed on a surface corresponding to said photosensitive substrate surface according to the overlapping part of said light beams, which image is formed through said projection optical system, and the other of said first mask reference mark and said first substrate reference mark;
    a step of correcting said first displacement;
    a step of measuring a second displacement between an image of one of a second mask reference mark formed on a surface corresponding to said mask surface and at a position different from said first mask reference mark and a second substrate reference mark formed on a surface corresponding to said photosensitive substrate surface and at a position different from said first substrate reference mark, which image is formed through said projection optical system, and the other of said second mask reference mark and said second substrate reference mark; and a step of correcting said second displacement.

14. An exposure method according to claim 13, wherein an imaging characteristics of at least one of said plurality of projection optical systems is corrected in said step of correcting said first displacement, and the position of said mask is corrected in said step of correcting said second displacement.

15. An exposure apparatus comprising:

an illumination optical system for illuminating a plurality of partial areas of a mask;

a plurality of projection optical systems for projecting images onto a photosensitive substrate, the light beam passing through each of said partial areas of said mask being partially overlapping;

a scanning mechanism for synchronously scanning said mask and said photosensitive substrate with respect to said projection optical systems in a predetermined direction;

a block having a mask reference mark arranged on a surface corresponding to said mask surface according to the overlapping part of said light beam and a substrate reference mark arranged on a surface corresponding to said photosensitive substrate surface according to the overlapping part of said light beam; and a displacement amount measurement unit for measuring a displacement between an image of one of said mask reference mark and said substrate reference mark, which image is formed through said projection optical system, and the other of said mask reference mark and said substrate reference mark.

16. An apparatus according to claim 15, wherein said plurality of projection optical system comprise a first group of projection optical systems arranged in a first direction and a second group of projection optical systems arranged apart from said first group by a predetermined space and substantially parallel to said first direction.

17. An apparatus according to claim 15, wherein the size of said mask reference mark is different from the size of said substrate reference mark.

18. An apparatus according to claim 1, wherein said plurality of projection optical systems comprise a first group of projection optical systems arranged in a first direction and a second group of projection optical systems arranged apart from the first group by a predetermined space and substantially parallel to said first direction.

19. An apparatus according to claim 1, wherein the size of said mask reference mark is different from the size of said substrate reference mark.

\* \* \* \* \*